US011626868B1

United States Patent
Chang

(10) Patent No.: US 11,626,868 B1
(45) Date of Patent: Apr. 11, 2023

(54) COMPARATOR CIRCUIT WITH DYNAMIC BIASING

(71) Applicant: ELITE SEMICONDUCTOR MICROELECTRONICS TECHNOLOGY INC., Hsinchu (TW)

(72) Inventor: Yao-Ren Chang, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 0 days.

(21) Appl. No.: 17/585,605

(22) Filed: Jan. 27, 2022

(51) Int. Cl.
*H03K 5/00* (2006.01)
*H03K 5/24* (2006.01)
*H03K 5/06* (2006.01)
*H03K 19/00* (2006.01)

(52) U.S. Cl.
CPC ............ *H03K 5/2418* (2013.01); *H03K 5/06* (2013.01); *H03K 5/2472* (2013.01); *H03K 5/2481* (2013.01); *H03K 19/0016* (2013.01)

(58) Field of Classification Search
CPC ...... H03K 5/2418; H03K 5/06; H03K 5/2472; H03K 5/2481
See application file for complete search history.

(56) References Cited

U.S. PATENT DOCUMENTS

| | | | | |
|---|---|---|---|---|
| 6,020,768 A | * | 2/2000 | Lim | H03K 5/2481 327/88 |
| 6,771,126 B2 | * | 8/2004 | Blankenship | H03F 3/45192 330/261 |
| 9,866,215 B2 | | 1/2018 | Atkinson et al. | |
| 10,056,892 B2 | | 8/2018 | Nicollini et al. | |
| 10,574,221 B2 | * | 2/2020 | Wang | H03K 5/2481 |
| 10,693,447 B1 | * | 6/2020 | Hao | H03K 5/2472 |
| 2013/0141059 A1 | * | 6/2013 | Parkhurst | H02M 3/156 323/271 |
| 2016/0336932 A1 | * | 11/2016 | Huang | H03K 5/2472 |
| 2019/0158072 A1 | * | 5/2019 | Tornila Oliver | G05F 3/262 |

* cited by examiner

*Primary Examiner* — Tuan T Lam

(57) ABSTRACT

A comparator circuit with dynamic biasing comprises a comparator, first dynamic biasing generator, first extra biasing device, second dynamic biasing generator, and second extra biasing device. The comparator includes a biasing circuit, input stage, active loads, and output terminal. The input stage has a first input terminal, second input terminal, first current path, and second current path. The comparator is configured to output an output signal at the output terminal according to the first input signal and second input signal. The first dynamic biasing generator is coupled between a first detection node and the first extra biasing device coupled to the biasing circuit. The second dynamic biasing generator is coupled between a second detection node and the second extra biasing device coupled to the biasing circuit. The first and second detection nodes are between the input stage and the active loads.

12 Claims, 4 Drawing Sheets

COMPARATOR CIRCUIT WITH DYNAMIC BIASING

BACKGROUND OF THE INVENTION

1. Field of the Invention

The present disclosure relates to a comparator circuit, and in particular to a comparator circuit with dynamic biasing.

2. Description of the Related Art

Comparator circuits are useful to compare multiple inputs such as in the form of multiple voltages and are utilized in a variety of electronic devices or products.

There are many different topologies of comparator circuits. However, some comparator circuits have the shortcomings, including delays inherent in the circuitry, which delays the time until a valid comparison decision can be made. Some other comparator circuits require operating in high amounts of current for reduced delays. For low power applications, it is difficult to implement comparator circuits to achieve both reduced delays and low power consumption.

BRIEF SUMMARY OF THE INVENTION

An objective of the present disclosure is to provide a comparator circuit with dynamic biasing. The comparator circuit is capable of operating at low quiescent current consumption with enhanced dynamic response by way of using dynamic biasing techniques.

To achieve at least the above objectives, the present disclosure provides a comparator circuit with dynamic biasing comprising a comparator, a first dynamic biasing generator, a first extra biasing device, a second dynamic biasing generator, and a second extra biasing device. The comparator includes a biasing circuit, an input stage, active loads, and an output terminal. The input stage has a first input terminal, a second input terminal, a first current path, and a second current path. The first input terminal is used for receiving a first input signal. The second input terminal is used for receiving a second input signal. The first current path is associated with the first input signal and coupled between the biasing circuit and a first detection node of the active loads. The second current path is associated with the second input signal and coupled between the biasing circuit and a second detection node of the active loads. The comparator is configured to output an output signal at the output terminal according to the first input signal and the second input signal. The first dynamic biasing generator has a first biasing input terminal coupled to the first detection node and having a first output current path. The first extra biasing device includes a first extra current mirror coupled between the first output current path and the biasing circuit. The second dynamic biasing generator has a second biasing input terminal coupled to the second detection node and having a second output current path. The second extra biasing device includes a second extra current mirror coupled between the second output current path and the biasing circuit.

In some embodiments, when the first input signal is less than the second input signal, the first dynamic biasing generator is active so that the first extra biasing device is active and provides additional bias current to the input stage. In some embodiments, when the first input signal is greater than the second input signal, the second dynamic biasing generator is active so that the second extra biasing device is active and provides additional bias current to the input stage.

In some embodiments, when the first input signal is less than the second input signal, the second dynamic biasing generator is active so that the second extra biasing device is active and provides additional bias current to the input stage. In some embodiments, when the first input signal is greater than the second input signal, the first dynamic biasing generator is active so that the first extra biasing device is active and provides additional bias current to the input stage.

In some embodiments, the first dynamic biasing generator further includes a first reference current path and a first filter coupled between the first biasing input terminal and the first reference current path for enhancing dynamic response of the first dynamic biasing generator in response to a signal at the first biasing input terminal.

In some embodiments, the second dynamic biasing generator further includes a second reference current path and a second filter coupled between the second biasing input terminal and the second reference current path for enhancing dynamic response of the second dynamic biasing generator in response to a signal at the second biasing input terminal.

In some embodiments, the first dynamic biasing generator further includes a first control transistor and a first filter. The first control transistor has the first output current path and a first biasing control terminal. The first filter is coupled between the first biasing input terminal and the first biasing control terminal for enhancing dynamic response of the first dynamic biasing generator in response to a signal at the first biasing input terminal.

In some embodiments, the second dynamic biasing generator further includes a second control transistor and a second filter. The second control transistor has the second output current path and a second biasing control terminal. The second filter is coupled between the second biasing input terminal and the second biasing control terminal for enhancing dynamic response of the second dynamic biasing generator in response to a signal at the second biasing input terminal.

In some embodiments, the input stage includes a first input transistor and a second input transistor. The first input transistor has the first current path and a first control terminal coupled to the first input terminal. The second input transistor has the second current path and a second control terminal coupled to the second input terminal.

In some embodiments, the active loads include a first internal current mirror, the first internal current mirror has a first internal reference current path coupled to the first detection node and has a first internal output current path coupled to the second detection node.

In some embodiments, the active loads further include a second internal current mirror, the second internal current mirror has a second internal reference current path coupled to the second detection node and has a second internal output current path coupled to the first detection node.

In some embodiments, the comparator further includes an output stage, the output stage has a third input terminal, a fourth input terminal, and an output current mirror. The third input terminal is coupled to the second detection node. The fourth input terminal is coupled to the first detection node. The output current mirror has a third reference current path associated with a signal at the third input terminal and has a third output current path associated with a signal at the fourth input terminal, wherein the third output current path includes the output terminal.

As such, the embodiments of the comparator circuit are capable of enhancing dynamic response by way of using dynamic biasing techniques. The response speed of the output signal of the comparator circuit can be enhanced accordingly.

DETAILED DESCRIPTION OF THE INVENTION

To facilitate understanding of the object, characteristics and effects of this present disclosure, embodiments together with the attached drawings for the detailed description of the present disclosure are provided.

Figure 1:
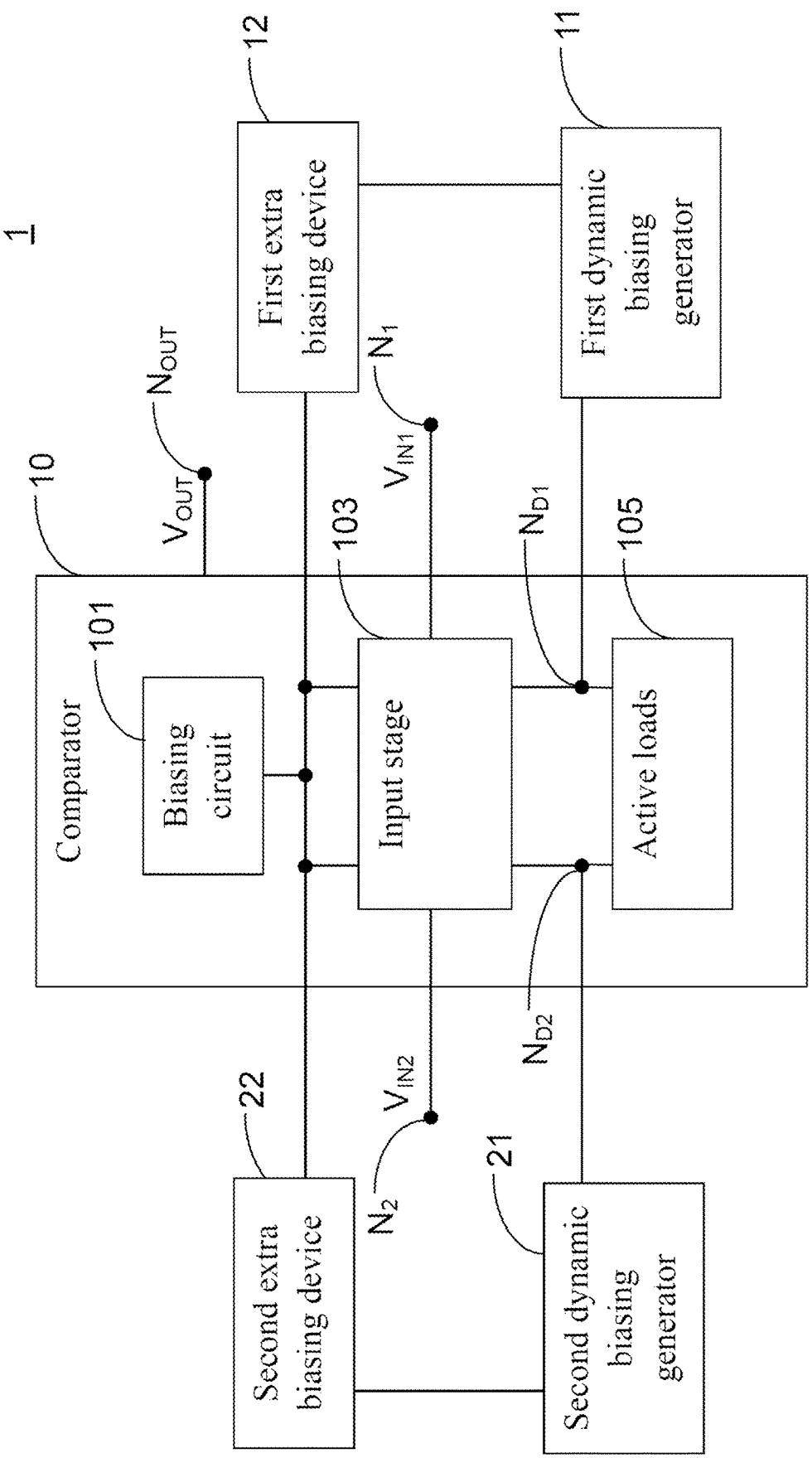
FIG. 1 is a schematic diagram illustrating exemplary architecture of a comparator circuit with dynamic biasing, representative of various embodiments of the present disclosure.

Referring to FIG. 1, exemplary architecture of a comparator circuit with dynamic biasing is illustrated, representative of various embodiments of the present disclosure. As shown in FIG. 1, a comparator circuit 1 with dynamic biasing comprises a comparator 10, a first dynamic biasing generator 11, a first extra biasing device 12, a second dynamic biasing generator 21, and a second extra biasing device 22.

The comparator 10 includes a biasing circuit 101, an input stage 103, active loads 105, and an output terminal $N_{OUT}$. The input stage 103 has a first input terminal $N_1$, a second input terminal $N_2$, a first current path, and a second current path. The first input terminal $N_1$ is used for receiving a first input signal $V_{IN1}$. The second input terminal $N_2$ is used for receiving a second input signal $V_{IN2}$. The first current path is associated with the first input signal $V_{IN1}$ and coupled between the biasing circuit 101 and a first detection node $N_{D1}$ of the active loads 105. The second current path is associated with the second input signal $V_{IN2}$ and coupled between the biasing circuit 101 and a second detection node $N_{D2}$ of the active loads 105. The comparator 10 is configured to output an output signal $V_{OUT}$ at the output terminal $N_{OUT}$ according to the first input signal $V_{IN1}$ and the second input signal $V_{IN2}$.

The first dynamic biasing generator 11 has a first biasing input terminal coupled to the first detection node $N_{D1}$ and has a first output current path. The first extra biasing device 12 includes a first extra current mirror coupled between the first output current path and the biasing circuit 101.

The second dynamic biasing generator 21 has a second biasing input terminal coupled to the second detection node $N_{D2}$ and has a second output current path. The second extra biasing device 22 includes a second extra current mirror coupled between the second output current path and the biasing circuit 101.

In some embodiments, when the first input signal $V_{IN1}$ is less than the second input signal $V_{IN2}$, the first dynamic biasing generator 11 is active so that the first extra biasing device 12 is active and provides additional bias current to the input stage 103.

In some embodiments, when the first input signal $V_{IN1}$ is greater than the second input signal $V_{IN2}$, the second dynamic biasing generator 21 is active so that the second extra biasing device 22 is active and provides additional bias current to the input stage 103.

As illustrated in the above embodiments, whenever there is a difference between the first input signal $V_{IN1}$ and the second input signal $V_{IN2}$, the total bias of the comparator 10 is a summation of the bias current provided by the biasing circuit 101 and the bias current provided by the first extra biasing device 12 or the second extra biasing device 22. In other words, the total bias of the comparator 10 is increased whenever there is a difference between the first input signal $V_{IN1}$ and the second input signal $V_{IN2}$.

Conversely, when there is no difference between the first input signal $V_{IN1}$ and the second input signal $V_{IN2}$, the comparator 10 is biased only by the biasing circuit 101. In this situation, the comparator 10 requires a reduced amount of bias current as compared with the situations where the total bias is enhanced as discussed above.

In some embodiments, the architecture of the comparator circuit 1 is suitable to be implemented as a low quiescent current (Iq) comparator circuit, which may operate at a low power mode (such as having quiescent current of nanoamperes) and supports an output current at an active power mode (such as having an output current of miliamperes) while the dynamic biasing can maintain in low quiescent current consumption. On the whole, the comparator circuit 1 can be also implemented to operate at low quiescent current consumption while the response speed can be enhanced. The architecture of the comparator circuit can be utilized as a basis for a variety of electronic devices and facilitates the low power applications, such as internet of things (IoT), in particular, the applications powered by batteries.

The following provides embodiments of the comparator circuit according to the exemplary architecture of FIG. 1.

Figure 2:
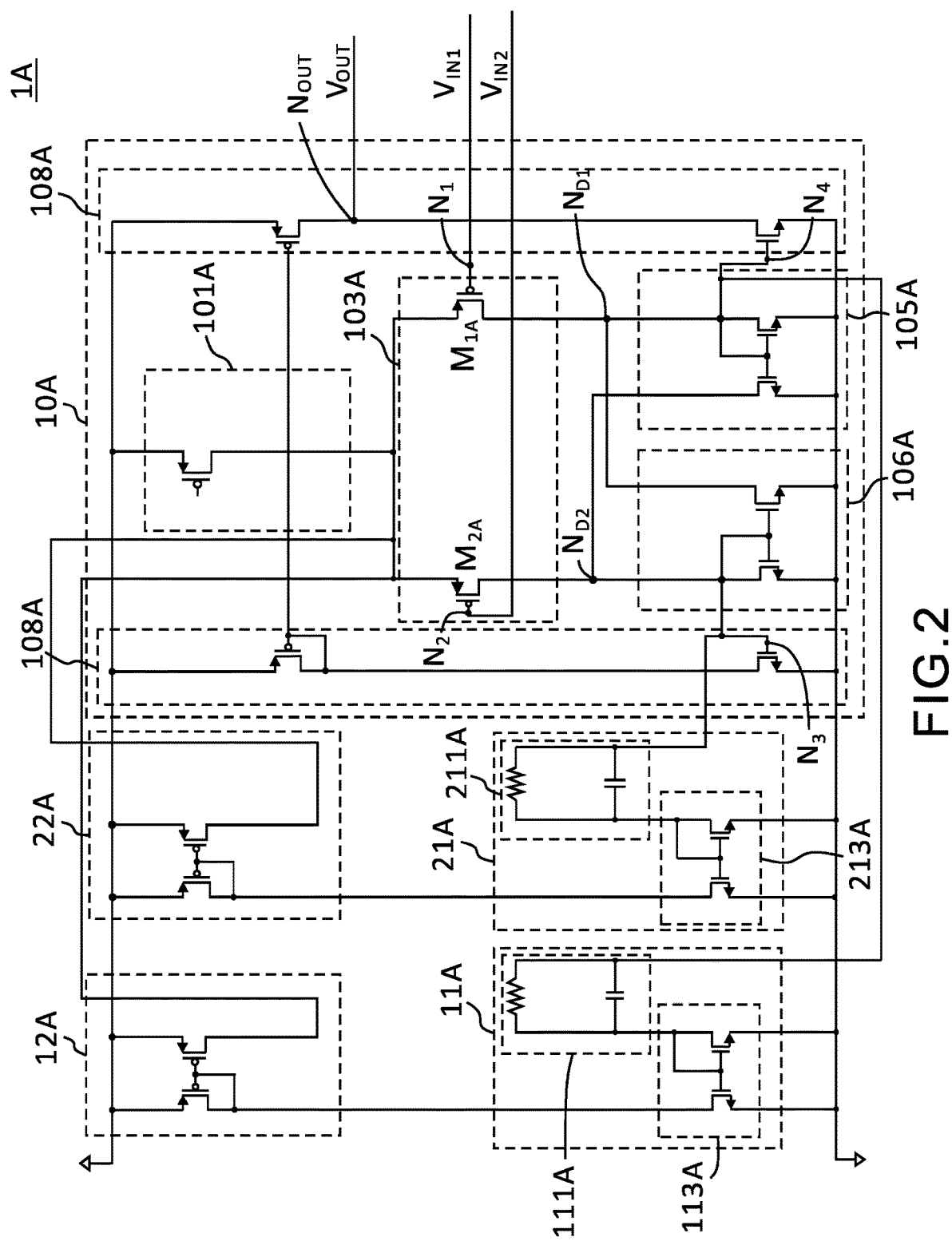
FIG. 2 is a circuit diagram of an embodiment of a comparator circuit according to the exemplary architecture of FIG. 1.

Referring to FIG. 2, a circuit diagram of an embodiment of a comparator circuit 1A according to the exemplary architecture of FIG. 1 is illustrated.

As shown in FIG. 2, the comparator circuit 1A with dynamic biasing comprises a comparator 10A, a first dynamic biasing generator 11A, a first extra biasing device 12A, a second dynamic biasing generator 21A, and a second extra biasing device 22A.

The comparator 10A is implemented according to the architecture of the comparator 10 shown in FIG. 1. The comparator 10A includes a biasing circuit 101A, an input stage 103A, active loads 105A and 106A, an output stage 108A, and an output terminal $N_{OUT}$. The input stage 103A has a first input terminal $N_1$, a second input terminal $N_2$, a first current path, and a second current path. As illustrated in FIG. 2, the input stage 103A includes a first input transistor $M_{1A}$ (e.g., PMOS) and a second input transistor $M_{2A}$ (e.g., PMOS). The first input transistor $M_{1A}$ has the first current path and a first control terminal coupled to the first input terminal $N_1$ for receiving a first input signal $V_{IN1}$. The second input transistor $M_{2A}$ has the second current path and a second control terminal coupled to the second input terminal $N_2$ for receiving a second input signal $V_{IN2}$. The first current path is controlled by the first input signal $V_{IN1}$ and coupled between the biasing circuit 101A and a first detection node ND' of the active loads 105A and 106A. The second current path is controlled by the second input signal $V_{IN2}$ and coupled between the biasing circuit 101A and a second detection node $N_{D2}$ of the active loads 105A and 106A. The comparator 10A is configured to output an output signal $V_{OUT}$ at the output terminal $N_{OUT}$ according to the first input signal $V_{IN1}$ and the second input signal $V_{IN2}$.

The first dynamic biasing generator 11A has a first biasing input terminal coupled to the first detection node $N_{D1}$, a first filter 111A, and a current mirror 113A. The current mirror 113A includes a first reference current path and a first output current path. The first filter 111A is coupled between the first biasing input terminal and the first reference current path for enhancing dynamic response of the first dynamic biasing generator 11A in response to a signal at the first biasing input terminal. For example, the first filter 111A includes a resistor and a capacitor in parallel to the resistor.

The first extra biasing device 12A includes a first extra current mirror coupled between the first output current path and the biasing circuit 101A.

The second dynamic biasing generator 21A has a second biasing input terminal coupled to the second detection node $N_{D2}$, a second filter 211A, and a current mirror 213A. The current mirror 213A includes a second reference current path and a second output current path. The second filter 211A is coupled between the second biasing input terminal and the second reference current path for enhancing dynamic response of the second dynamic biasing generator 21A in response to a signal at the second biasing input terminal. For example, the second filter 211A includes a resistor and a capacitor in parallel to the resistor.

The second extra biasing device 22A includes a second extra current mirror coupled between the second output current path and the biasing circuit 101A.

In FIG. 2, when the first input signal $V_{IN1}$ is less than the second input signal $V_{IN2}$, the voltage at the first detection node $N_{D1}$ is increased and the voltage at the second detection node $N_{D2}$ is reduced. Accordingly, the first dynamic biasing generator 11A is active so that the first extra biasing device 12A is active and provides additional bias current to the input stage 103A.

In FIG. 2, when the first input signal $V_{IN1}$ is greater than the second input signal $V_{IN2}$, the voltage at the first detection node $N_{D1}$ is reduced and the voltage at the second detection node $N_{D2}$ is increased. Accordingly, the second dynamic biasing generator 21A is active so that the second extra biasing device 22A is active and provides additional bias current to the input stage 103A.

As illustrated in the above embodiments, whenever there is a difference between the first input signal Vim and the second input signal $V_{IN2}$, the total bias of the comparator 10A is a summation of the bias current provided by the biasing circuit 101A and the bias current provided by the first extra biasing device 12A or the second extra biasing device 22A. In other words, the total bias of the comparator 10A is increased whenever there is a difference between the first input signal Vim and the second input signal $V_{IN2}$.

Figure 3:
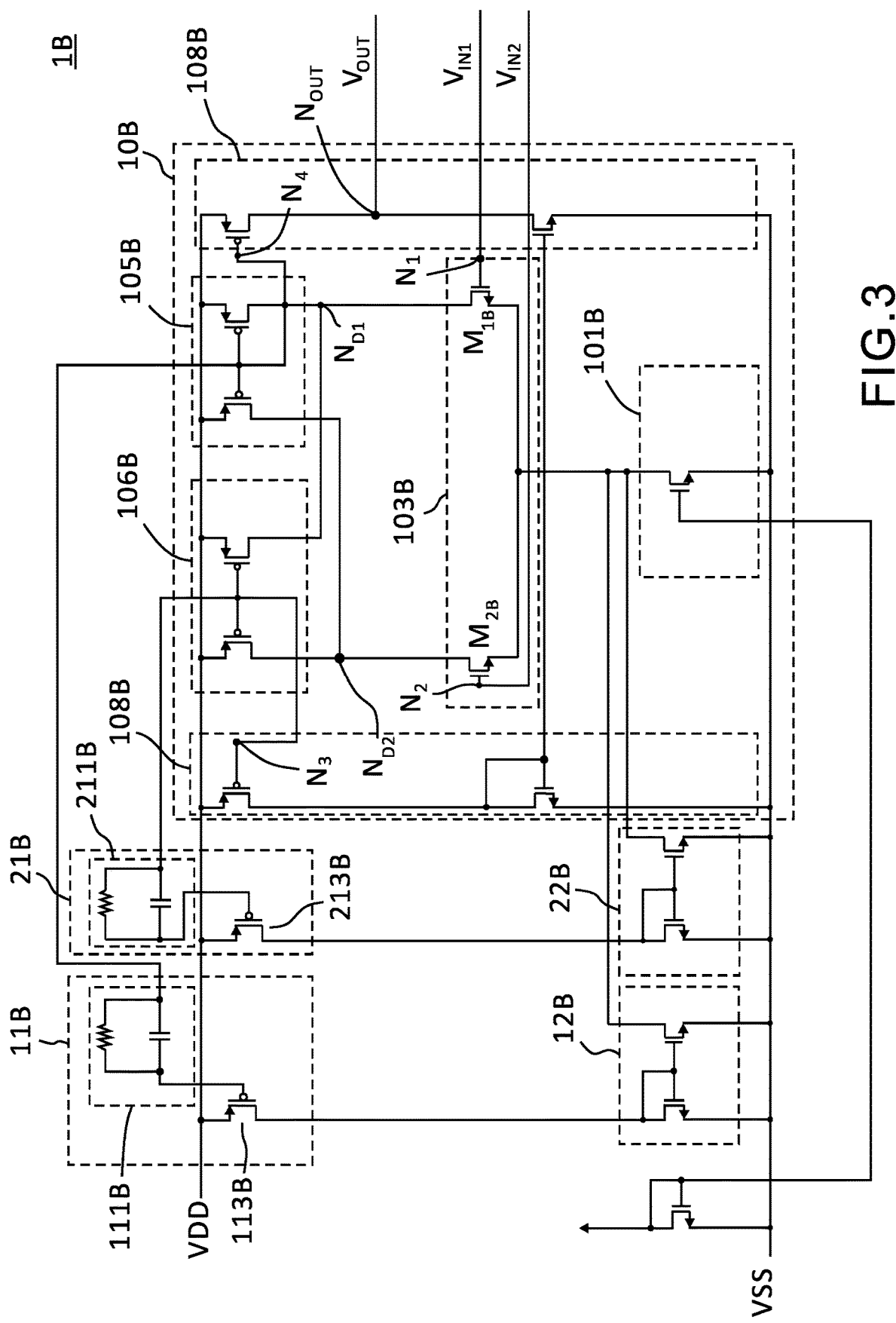
FIG. 3 is a circuit diagram of another embodiment of a comparator circuit according to the exemplary architecture of FIG. 1.

Referring to FIG. 3, a circuit diagram of an embodiment of a comparator circuit 1B according to the exemplary architecture of FIG. 1 is illustrated.

As shown in FIG. 3, the comparator circuit 1B with dynamic biasing comprises a comparator 10B, a first dynamic biasing generator 11B, a first extra biasing device 12B, a second dynamic biasing generator 21B, and a second extra biasing device 22B, wherein VDD and VSS denote two power supply signals.

The comparator 10B is implemented according to the architecture of the comparator 10 shown in FIG. 1. The comparator 10B includes a biasing circuit 101B, an input stage 103B, active loads 105B and 106B, an output stage 108B, and an output terminal $N_{OUT}$. The input stage 103B has a first input terminal $N_1$, a second input terminal $N_2$, a first current path, and a second current path. As illustrated in FIG. 3, the input stage 103B includes a first input transistor $M_{1B}$ (e.g., NMOS) and a second input transistor $M_{2B}$ (e.g., NMOS). The first input transistor $M_{1B}$ has the first current path and a first control terminal coupled to the first input terminal $N_1$ for receiving a first input signal $V_{IN1}$. The second input transistor $M_{2B}$ has the second current path and a second control terminal coupled to the second input terminal $N_2$ for receiving a second input signal Vim. The first current path is controlled by the first input signal $V_{IN1}$ and coupled between the biasing circuit 101B and a first detection node $N_{D1}$ of the active loads 105B and 106B. The second current path is controlled by the second input signal $V_{IN2}$ and coupled between the biasing circuit 101B and a second detection node $N_{D2}$ of the active loads 105B and 106B. The comparator 10B is configured to output an output signal $V_{OUT}$ at the output terminal $N_{OUT}$ according to the first input signal $V_{IN1}$ and the second input signal $V_{IN2}$.

The first dynamic biasing generator 11B has a first biasing input terminal coupled to the first detection node $N_{D1}$, a first filter 111B, and a first control transistor 113B. The first control transistor 113B has a first output current path and a first biasing control terminal. The first filter 111B is coupled between the first biasing input terminal and the first biasing control terminal for enhancing dynamic response of the first dynamic biasing generator 11B in response to a signal at the first biasing input terminal. For example, the first filter 111B includes a resistor and a capacitor in parallel to the resistor.

The first extra biasing device 12B includes a first extra current mirror coupled between the first output current path and the biasing circuit 101B.

The second dynamic biasing generator 21B has a second biasing input terminal coupled to the second detection node $N_{D2}$, a second filter 211B, and a second control transistor 213B. The second control transistor 213B has a second output current path and a second biasing control terminal. The second filter 211B is coupled between the second biasing input terminal and the second biasing control terminal for enhancing dynamic response of the second dynamic biasing generator 21B in response to a signal at the second biasing input terminal. For example, the second filter 211B includes a resistor and a capacitor in parallel to the resistor.

The second extra biasing device 22B includes a second extra current mirror coupled between the second output current path and the biasing circuit 101B.

In FIG. 3, when the first input signal $V_{IN1}$ is less than the second input signal $V_{IN2}$, the voltage at the first detection node $N_{D1}$ is increased and the voltage at the second detection node $N_{D2}$ is reduced. Accordingly, the second dynamic biasing generator 21B is active so that the second extra biasing device 22B is active and provides additional bias current to the input stage 103B.

In FIG. 3, when the first input signal $V_{IN1}$ is greater than the second input signal $V_{IN2}$, the voltage at the first detection node $N_{D1}$ is reduced and the voltage at the second detection node $N_{D2}$ is increased. Accordingly, the first dynamic biasing generator 11B is active so that the first extra biasing device 12B is active and provides additional bias current to the input stage 103B.

As illustrated in the above embodiments, whenever there is a difference between the first input signal $V_{IN1}$ and the second input signal $V_{IN2}$, the total bias of the comparator 10B is a summation of the bias current provided by the biasing circuit 101B and the bias current provided by the first extra biasing device 12B or the second extra biasing device 22B. In other words, the total bias of the comparator 10B is increased whenever there is a difference between the first input signal $V_{IN1}$ and the second input signal $V_{IN2}$.

Further, in the embodiment of FIG. 2 or FIG. 3, the active load 105A (or 105B) includes a first internal current mirror, the first internal current mirror has a first internal reference current path coupled to the first detection node $N_{D1}$ and has a first internal output current path coupled to the second detection node $N_{D2}$.

In the embodiment of FIG. 2 or FIG. 3, the active load 106A (or 106B) includes a second internal current mirror, the second internal current mirror has a second internal reference current path coupled to the second detection node $N_{D2}$ and has a second internal output current path coupled to the first detection node $N_{D1}$.

In some embodiments as illustrated in FIG. 2 or FIG. 3, the comparator 10A (or 10B) may further include an output stage 108A (or 108B), the output stage 108A (or 108B) has a third input terminal $N_3$, a fourth input terminal $N_4$, and an output current mirror. The third input terminal $N_3$ is coupled to the second detection node $N_{D2}$. The fourth input terminal $N_4$ is coupled to the first detection node $N_{D1}$. The output current mirror (e.g., including two transistors) has a third reference current path which is associated with (e.g., controlled by) a signal at the third input terminal $N_3$ and has a third output current path which is associated with (e.g., controlled by) a signal at the fourth input terminal $N_4$, wherein the third output current path includes the output terminal $N_{OUT}$.

In the embodiment of FIG. 2 or FIG. 3, the biasing circuit (e.g., 101A or 101B) can be implemented by a suitable biasing circuit, for example, an active load or current source, such as a current mirror, as illustrated by the biasing circuit 101B in FIG. 3.

Figure 4:
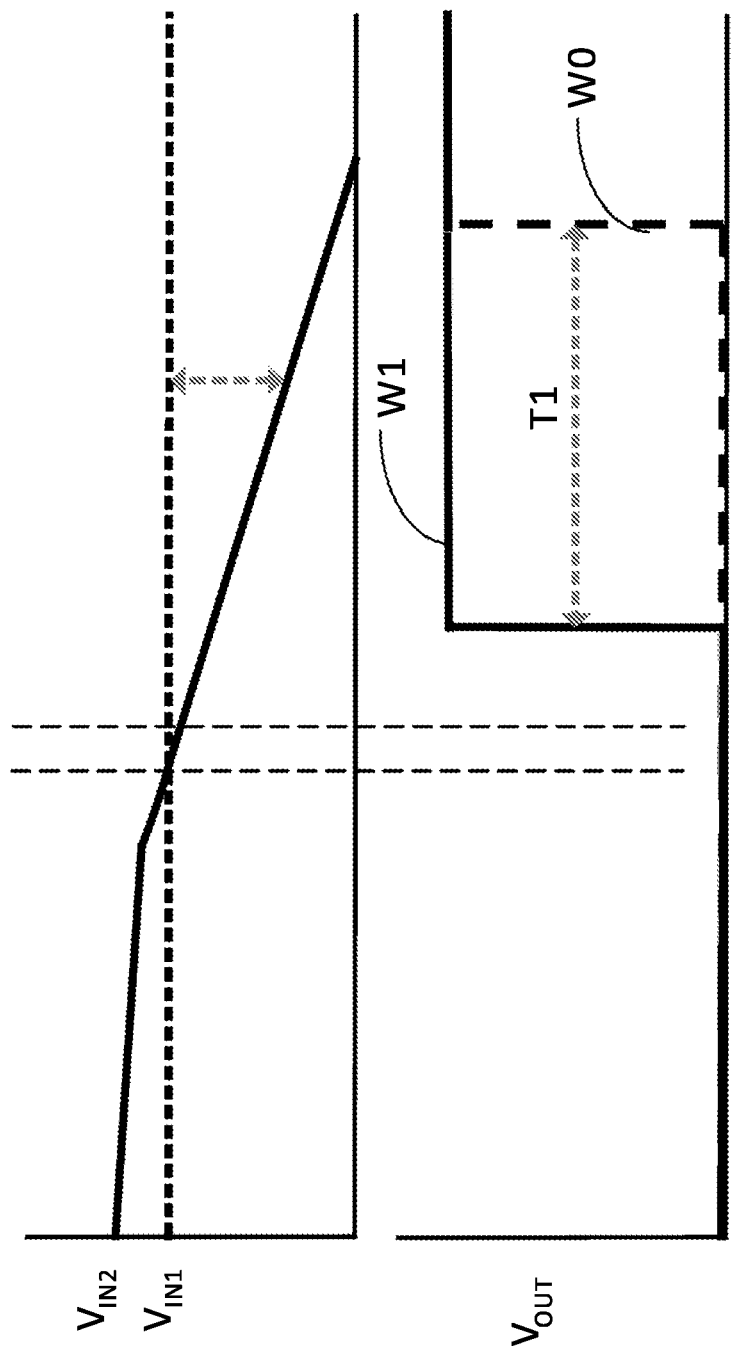
FIG. 4 is a schematic diagram illustrating examples of output signal variations of the comparator circuit.

Referring to FIG. 4, a schematic diagram illustrating examples of output signal variations of the comparator circuit according to FIG. 1. In FIG. 4, an example of a first input signal $V_{IN1}$ and a second input signal $V_{IN2}$ is illustrated. When the first input signal $V_{IN1}$ is greater than the second input signal $V_{IN2}$ in voltage level, the response speed of the output signal $V_{OUT}$ (represented by W1) of the comparator circuit 1 according to FIG. 1 can be enhanced. As compared with the output signal (represented by W0) of the comparator 10 without dynamic biasing (e.g., without dynamic biasing generators and extra biasing devices), the output signal $V_{OUT}$ (represented by W1) of the comparator circuit 1 according to FIG. 1 is generated in advance with an interval T1.

As illustrated above, the embodiments of the comparator circuit according to FIG. 1 are capable of enhancing dynamic response by way of using dynamic biasing techniques. Thus, the response speed of the output signal of the comparator circuit can be enhanced. The comparator circuit can be also implemented to operate at low quiescent current consumption while the response speed can be enhanced.

While the present disclosure has been described by way of specific embodiments, numerous modifications, combinations, and variations could be made thereto by those skilled in the art without departing from the scope and spirit of the present disclosure set forth in the claims.

What is claimed is:

1. A comparator circuit with dynamic biasing comprising:
   a comparator including a biasing circuit, an input stage, active loads, and an output terminal, wherein the input stage has:
   a first input terminal for receiving a first input signal;
   a second input terminal for receiving a second input signal;
   a first current path associated with the first input signal and coupled between the biasing circuit and a first detection node of the active loads; and
   a second current path associated with the second input signal and coupled between the biasing circuit and a second detection node of the active loads;
   wherein the comparator is configured to output an output signal at the output terminal according to the first input signal and the second input signal;
   a first dynamic biasing generator having a first biasing input terminal coupled to the first detection node and having a first output current path;
   wherein the first dynamic biasing generator further includes:
   a first control transistor having the first output current path and a first biasing control terminal; and
   a first filter coupled between the first biasing input terminal and the first biasing control terminal for enhancing dynamic response of the first dynamic biasing generator in response to a signal at the first biasing input terminal;
   a first extra biasing device including a first extra current mirror coupled between the first output current path and the biasing circuit;
   a second dynamic biasing generator having a second biasing input terminal coupled to the second detection node and having a second output current path; and
   a second extra biasing device including a second extra current mirror coupled between the second output current path and the biasing circuit.

2. The comparator circuit according to claim 1, wherein when the first input signal is less than the second input signal, the first dynamic biasing generator is active so that the first extra biasing device is active and provides additional bias current to the input stage.

3. The comparator circuit according to claim 2, wherein when the first input signal is greater than the second input signal, the second dynamic biasing generator is active so that the second extra biasing device is active and provides additional bias current to the input stage.

4. The comparator circuit according to claim 1, wherein when the first input signal is less than the second input signal, the second dynamic biasing generator is active so that the second extra biasing device is active and provides additional bias current to the input stage.

5. The comparator circuit according to claim 4, wherein when the first input signal is greater than the second input signal, the first dynamic biasing generator is active so that the first extra biasing device is active and provides additional bias current to the input stage.

6. The comparator circuit according to claim 1, wherein the first dynamic biasing generator further includes a first reference current path and the first filter coupled between the first biasing input terminal and the first reference current path for enhancing dynamic response of the first dynamic biasing generator in response to the signal at the first biasing input terminal.

7. The comparator circuit according to claim 6, wherein the second dynamic biasing generator further includes a second reference current path and a second filter coupled between the second biasing input terminal and the second reference current path for enhancing dynamic response of the second dynamic biasing generator in response to a signal at the second biasing input terminal.

8. The comparator circuit according to claim 1, wherein the second dynamic biasing generator further includes:

a second control transistor having the second output current path and a second biasing control terminal; and a second filter coupled between the second biasing input terminal and the second biasing control terminal for enhancing dynamic response of the second dynamic biasing generator in response to a signal at the second biasing input terminal.

9. The comparator circuit according to claim 1, wherein the input stage includes:

a first input transistor having the first current path and a first control terminal coupled to the first input terminal; and a second input transistor having the second current path and a second control terminal coupled to the second input terminal.

10. The comparator circuit according to claim 1, wherein the active loads include a first internal current mirror, the first internal current mirror has a first internal reference current path coupled to the first detection node and has a first internal output current path coupled to the second detection node.

11. The comparator circuit according to claim 10, wherein the active loads further include a second internal current mirror, the second internal current mirror has a second internal reference current path coupled to the second detection node and has a second internal output current path coupled to the first detection node.

12. The comparator circuit according to claim 1, wherein the comparator further includes an output stage, the output stage has:

a third input terminal coupled to the second detection node;

a fourth input terminal coupled to the first detection node;

an output current mirror having a third reference current path associated with a signal at the third input terminal and having a third output current path associated with a signal at the fourth input terminal;

wherein the third output current path includes the output terminal.

\* \* \* \* \*